United States Patent
Koshimizu et al.

(10) Patent No.: US 9,952,032 B2
(45) Date of Patent: Apr. 24, 2018

(54) TEMPERATURE MEASURING METHOD, SUBSTRATE PROCESSING SYSTEM AND COMPONENT TO BE PROVIDED IN SUBSTRATE PROCESSING APPARATUS OF THE SUBSTRATE PROCESSING SYSTEM

(71) Applicant: TOKYO ELECTRON LIMITED, Tokyo (JP)

(72) Inventors: Chishio Koshimizu, Yamanashi (JP); Tatsuo Matsudo, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 564 days.

(21) Appl. No.: 14/570,016

(22) Filed: Dec. 15, 2014

(65) Prior Publication Data

US 2015/0168231 A1 Jun. 18, 2015

(30) Foreign Application Priority Data

Dec. 16, 2013 (JP) .................................. 2013-259229

(51) Int. Cl.
| | |
|---|---|
| *G01K 11/32* | (2006.01) |
| *G01J 5/08* | (2006.01) |
| *G01B 9/02* | (2006.01) |
| *H01J 37/32* | (2006.01) |
| *G01K 11/12* | (2006.01) |

(52) U.S. Cl.
CPC ....... *G01B 9/02021* (2013.01); *G01B 9/0209* (2013.01); *G01B 9/02044* (2013.01); *G01K 11/125* (2013.01); *H01J 37/32522* (2013.01); *H01J 37/32935* (2013.01); *H01J 37/32972* (2013.01)

(58) Field of Classification Search
CPC . G01K 11/13; G01K 11/32; G01J 5/54; G01J 5/08; H01J 37/32798
USPC ............. 156/345.27; 118/712; 374/121, 131, 374/130, 141, 161, 178, 160, 4
See application file for complete search history.

(56) References Cited

U.S. PATENT DOCUMENTS

| | | | | |
|---|---|---|---|---|
| 4,426,155 A | * | 1/1984 | Monchalin | ............ G01J 9/0246 356/452 |
| 5,322,361 A | | 6/1994 | Cabib et al. | |
| 7,126,693 B2 | * | 10/2006 | Everett | ................ A61B 5/0066 356/369 |

(Continued)

FOREIGN PATENT DOCUMENTS

| | | |
|---|---|---|
| JP | 2012-204742 A | 10/2012 |
| JP | 2013-29487 A | 2/2013 |

*Primary Examiner* — Gail Kaplan Verbitsky
(74) *Attorney, Agent, or Firm* — Rothwell, Figg, Ernst & Manbeck, P.C.

(57) ABSTRACT

A temperature measuring method of a component of a substrate processing chamber including a surface being worn or being deposited with a foreign material by using. The method includes: providing data representing a relationship between a temperature of the component and an optical path length of a predetermined path within the component; measuring an optical path length of the predetermined path within the component by using optical interference of reflection lights of a low-coherence light from the component when the low-coherence light is irradiated onto the component to travel through the predetermined path; and obtaining a temperature of the component by comparing the measured optical path length with the data.

11 Claims, 7 Drawing Sheets

(56) References Cited

U.S. PATENT DOCUMENTS

| | | | |
|---|---|---|---|
| 7,242,480 B2* | 7/2007 | Alphonse | A61B 5/0066 356/479 |
| 7,355,715 B2* | 4/2008 | Suzuki | G01J 5/0003 356/478 |
| 7,542,148 B2* | 6/2009 | Koshimizu | G01J 5/0003 356/497 |
| 8,570,524 B2* | 10/2013 | Wan | G01J 3/02 356/451 |
| 8,941,843 B2* | 1/2015 | Nagai | G01K 11/12 356/503 |
| 9,500,537 B2* | 11/2016 | Abe | G01K 11/125 |
| 2005/0088658 A1* | 4/2005 | Soskind | G01J 9/00 356/454 |
| 2007/0139656 A1* | 6/2007 | Wan | G01B 11/0675 356/504 |
| 2010/0206482 A1* | 8/2010 | Matsudo | G01J 5/0003 156/345.27 |
| 2011/0235675 A1* | 9/2011 | Matsudo | H01L 21/67109 374/130 |
| 2012/0207189 A1* | 8/2012 | Abe | G01K 11/125 374/161 |
| 2012/0243572 A1* | 9/2012 | Matsudo | G01J 5/0007 374/161 |
| 2012/0247669 A1* | 10/2012 | Matsudo | G01K 5/50 156/345.27 |
| 2012/0251759 A1* | 10/2012 | Yamawaku | G01K 5/48 428/58 |
| 2012/0327394 A1 | 12/2012 | Matsudo et al. | |
| 2013/0128275 A1* | 5/2013 | Matsudo | G01B 11/06 356/451 |
| 2013/0308681 A1* | 11/2013 | Yamawaku | G01K 5/48 374/161 |
| 2014/0056328 A1* | 2/2014 | Abe | G01K 11/125 374/161 |
| 2015/0168231 A1* | 6/2015 | Koshimizu | G01K 11/125 156/345.27 |

* cited by examiner ized sourceUS 9,952,032 B2

TEMPERATURE MEASURING METHOD, SUBSTRATE PROCESSING SYSTEM AND COMPONENT TO BE PROVIDED IN SUBSTRATE PROCESSING APPARATUS OF THE SUBSTRATE PROCESSING SYSTEM

CROSS-REFERENCE TO RELATED APPLICATION

This application claims priority to Japanese Patent Application No. 2013-259229 filed on Dec. 16, 2013, the entire contents of which are incorporated herein by reference.

FIELD OF THE INVENTION

The present invention relates to a component to be provided in a substrate processing chamber of a substrate processing apparatus, a temperature measuring method for measuring a temperature of a substrate or the component to be provided in the substrate processing chamber of the substrate processing apparatus, and a substrate processing system including a temperature measuring device for measuring the temperature of the component.

BACKGROUND OF THE INVENTION

For example, in a substrate processing apparatus for performing a process, such as plasma etching and the like, on a semiconductor wafer by using a plasma generated in a substrate processing chamber, temperatures of the semiconductor wafer and various components provided in the substrate processing chamber are measured and process conditions such as plasma generation conditions and the like are controlled to secure processing precision.

As one example, there has been proposed a temperature measuring method for measuring a temperature of a focus ring, which greatly affects a plasma distribution on a semiconductor wafer, by performing Fourier transform on a distribution of intensity of lights reflected at front and rear surfaces of the focus ring when the focus ring is irradiated with a low-coherence light in the thickness direction thereof (see, e.g., Japanese Patent Application Publication No. 2013-029487 (JP2013-029487A)).

As another example, there has been proposed a temperature measuring method for measuring a temperature of a focus ring including a thin portion at a rear surface side thereof and a coating member which is disposed with a predetermined space between the thin portion and the coating member, by using an interference light between each of reflection lights at front and rear surfaces of the thin portion when the thin portion is irradiated with a low-coherence light in the thickness direction thereof and a reflection light obtained by irradiating a low-coherence light on a reference mirror (see, e.g., Japanese Patent Application Publication No. 2012-204742 (JP2012-204742A)).

Both techniques described in JP2013-029487A and JP2012-204742A use thickness change of a focus ring according to the temperature thereof by an effect of coefficient of thermal expansion. That is, a relationship between the thickness of the focus ring and the temperature thereof is previously measured, the thickness of the focus ring is obtained by using a low-coherence light, and the obtained thickness of the focus ring is compared with the previously measured relationship between the thickness of the focus ring and the temperature thereof, whereby the temperature of the focus ring can be measured.

However, in the technique of JP2013-029487A, when the front or the rear surface of the object to be temperature-measured, i.e., the focus ring, to which a low-coherence light is irradiated is worn or is deposited with a foreign material, it is difficult to measure a thickness of the object and, thus, a precise temperature of the object may not be obtained. In contrast, in the technique of JP2012-204742A, since states of the front and the rear surfaces of the thin portion are not changed, precise temperature measurement is possible. However, there is a drawback in which a cost may increase due to the increase in the number of components and a precise temperature measurement may not be ensured when an assembly accuracy gets worse.

SUMMARY OF THE INVENTION

In view of the above, the present invention provides a method for measuring a temperature of an object by using interference between low-coherence lights even when the object is worn or is deposited with a foreign material. The present invention further provides, in order to execute the method, a substrate processing system including a component provided in a substrate processing chamber of a substrate processing apparatus and a temperature measuring device for measuring a temperature of the component.

In accordance with an aspect of the present invention, there is provided a temperature measuring method of a component disposed in a substrate processing chamber. The component includes at least one surface being worn or being deposited with a foreign material with a lapse of time.

The method includes: providing data representing a relationship between a temperature of the component and an optical path length of a predetermined path within the component; measuring an optical path length of the predetermined path within the component by using optical interference of reflection lights of a low-coherence light from the component when the low-coherence light is irradiated onto the component to travel through the predetermined path; and obtaining a current temperature of the component by comparing the measured optical path length with the data.

The predetermined path is set such that a portion of the low-coherence light entering into the component through a first surface of the component which is not worn and is not deposited with a foreign material is reflected at a reflection surface of the component to proceed to a second surface of the component which is not worn and is not deposited with a foreign material and travels back along a route through which the portion of the low-coherence light has traveled, after being reflected at the second surface.

In accordance with another aspect of the present invention, there is provided a temperature measuring method of a component disposed in a substrate processing chamber. The component includes at least one surface being worn or being deposited with a foreign material with a lapse of time.

The method includes: providing data representing a relationship between a temperature of the component and an optical path length of a predetermined path within the component; measuring an optical path length of the predetermined path within the component by using optical interference of reflection lights of a low-coherence light from the component when the low-coherence light is irradiated onto the component to travel through the predetermined path; and obtaining a current temperature of the component by comparing the measured optical path length with the data.

The predetermined path is set such that a portion of the low-coherence light entering into the component through an entrance surface of the component which is not worn and is not deposited with a foreign material is reflected at a slit which is formed to be parallel to the entrance surface and travels back along a route through which the portion of the low-coherence light has traveled.

In accordance with still another aspect of the present invention, there is provided a substrate processing system including: a substrate processing chamber configured to perform a predetermined process on a substrate accommodated therein; a component provided in the substrate processing chamber and including at least one surface being worn or being deposited with a foreign material with a lapse of time during the predetermined process; and a temperature measuring device configured to measure a temperature of the component.

The temperature measuring device includes: an optical system configured to irradiate a low-coherence light to the component and receive reflection lights of the low-coherence light; and an analyzer configured to measure an optical path length of a predetermined path within the component through which the low-coherence light travels by using optical interference of the reflection lights from the component and obtain a current temperature of the component by comparing the optical path length with previously generated data representing a relationship between a temperature of the component and an optical path length of the predetermined path.

The component further includes: a first surface to which the low-coherence light from the optical system is irradiated and which is not worn and is not deposited with a foreign material with a lapse of time; a second surface which is not worn and is not deposited with a foreign material with a lapse of time; and a reflection surface at which a portion of the low-coherence light entering into the component at the first surface is reflected to proceed to the second surface.

The predetermined path is set such that the portion of the low-coherence light entering into the component through the first surface is reflected at the reflection surface to proceed to the second surface and travels back along a route through which the portion of the low-coherence light has traveled, after being reflected at the second surface In accordance with still another aspect of the present invention, there is provided a substrate processing system including: a substrate processing chamber configured to perform a predetermined process on a substrate accommodated therein; a component provided in the substrate processing chamber and including at least one surface being worn or being deposited with a foreign material with a lapse of time during the predetermined process; and a temperature measuring device configured to measure a temperature of the component.

The temperature measuring device includes: an optical system configured to irradiate a low-coherence light to the component and receive reflection lights of the low-coherence light; and an analyzer configured to measure an optical path length of a predetermined path within the component through which the low-coherence light travels by using optical interference of the reflection lights from the component and obtain a current temperature of the component by comparing the optical path length with previously generated data representing a relationship between a temperature of the component and an optical path length of the predetermined path.

The component further includes: an entrance surface to which a portion of the low-coherence light from the optical system is irradiated and which is not worn and is not deposited with a foreign material with a lapse of time; and a slit is formed to be parallel to the entrance surface.

The predetermined path is set such that the portion of the low-coherence light entering into the component through the entrance surface of the component is reflected at the slit and travels back along a route through which the portion of the low-coherence light has traveled.

In accordance with still another aspect of the present invention, there is provided a component to be provided in a substrate processing apparatus. The component includes: at least one surface being worn or being deposited with a foreign material with a lapse of time during an operation of the substrate processing apparatus in which the component is provided; a first surface to which a low-coherence light is irradiated and which is not worn and is not deposited with a foreign material with a lapse of time; a second surface which is not worn and is not deposited with a foreign material with a lapse of time; and a reflection surface at which a portion of the low-coherence light entering into the component through the first surface is reflected to proceed to the second surface.

The reflection surface and the second surface are disposed such that the portion of the low-coherence light proceeded to the second surface travels back along a route through which the portion of the low-coherence has traveled after being reflected at the second surface.

In accordance with still another aspect of the present invention, there is provided a component to be provided in a substrate processing apparatus. The component includes: at least one surface which is worn or is deposited with a foreign material with a lapse of time during an operation of the substrate processing apparatus in which the component is provided; an entrance surface to which a low-coherence light is irradiated and which is not worn and is not deposited with a foreign material with a lapse of time; and a slit formed to be parallel to the entrance surface and serving to reflect a portion of the low-coherence light, which has entered the component through the entrance surface in a direction perpendicular to the entrance surface, to travel back along a route through which the portion of low-coherence light has traveled.

In accordance with still another aspect of the present invention, there is provided a component to be provided in a substrate processing apparatus. The component includes: a first member including at least one surface which is worn or is deposited with a foreign material with a lapse of time during an operation of the substrate processing apparatus in which the component is provided; and a second member disposed adjacent to the first member.

The first member includes: an entrance surface which is not worn and is not deposited with a foreign material with a lapse of time; and a slit formed to be parallel to the entrance surface and serving to reflect a portion of a low-coherence light, which has entered the component through the entrance surface in a direction perpendicular to the entrance surface, to travel back along a route through which the portion of the low-coherence light has traveled.

The second member includes a reflection surface for reflecting the low-coherence light irradiated thereto in a direction perpendicular to the entrance surface of the first member.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, embodiments of the present invention will be described in detail with reference to the accompanying drawings. Here, there will be described a substrate processing system in which a temperature measuring device for executing a temperature measuring method in accordance with an embodiment is applied to a substrate processing apparatus for performing plasma etching onto a semiconductor wafer (hereinafter, referred to as a wafer) as a substrate.

Figure 1:
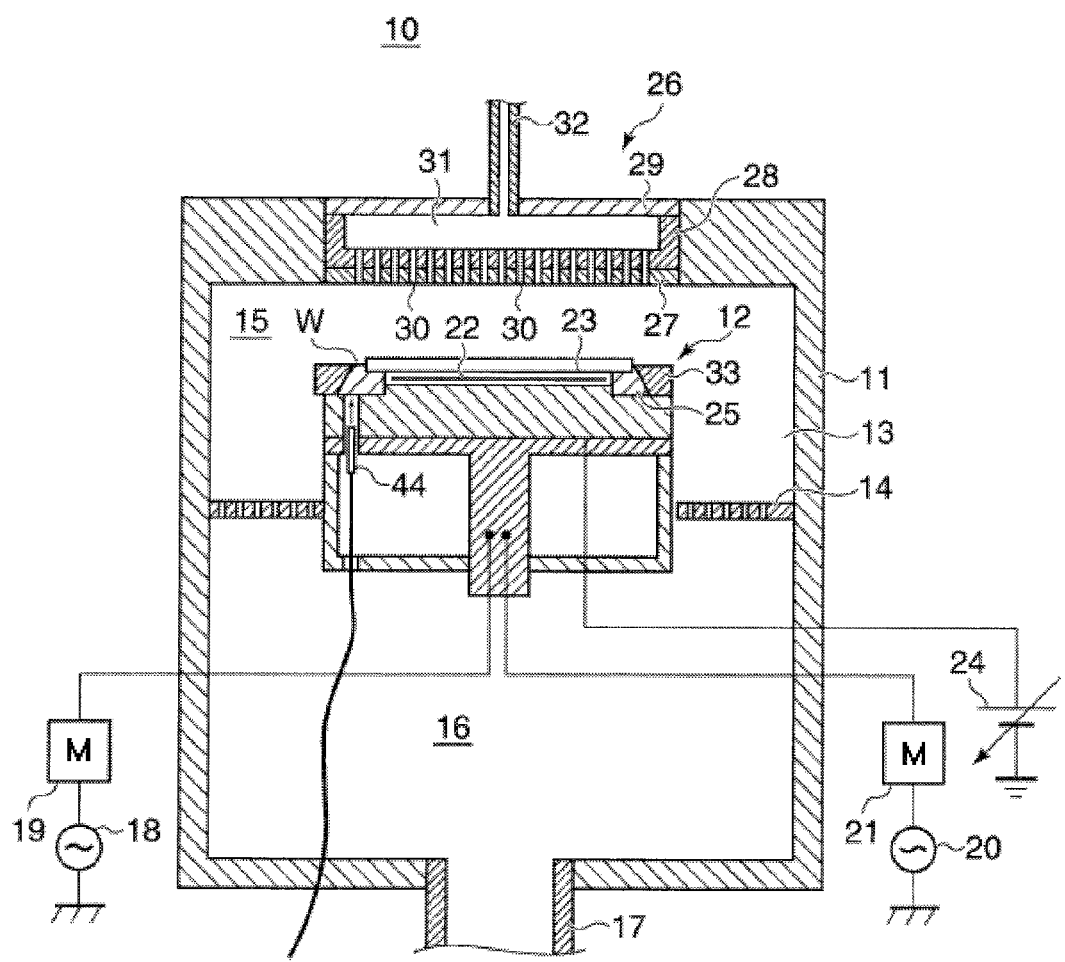
FIG. 1 is a cross-sectional view showing a configuration of a substrate processing apparatus to which a temperature measuring device in accordance with an embodiment of the present invention can be applied.

FIG. 1 is a cross-sectional view schematically showing a configuration of a substrate processing apparatus 10 to which a temperature measuring device in accordance with the embodiment of the present invention can be applied. As shown in FIG. 1, the substrate processing apparatus 10 includes a chamber 11 where a semiconductor device wafer W of a diameter of, e.g., 300 mm is accommodated. A cylindrical susceptor 12 (mounting table) for mounting thereon the wafer W is disposed in the chamber 11. In the substrate processing apparatus 10, a side exhaust passage 13 is formed between an inner wall of the chamber 11 and a side surface of the susceptor 12, and a gas exhaust plate 14 is disposed in the midway of the side exhaust passage 13.

The gas exhaust plate 14 is a plate-shaped member having a plurality of through holes. The gas exhaust plate 14 serves as a partitioning plate that partitions the inner space of the chamber 11 into an upper portion and a lower portion. As will be described later, a plasma is generated in a substrate processing chamber 15 defined at the upper portion of the chamber 11 by the gas exhaust plate 14. A gas exhaust pipe 17 through which a gas in the chamber 11 is discharged is connected to a gas exhaust chamber (manifold) 16 defined at the lower portion of the chamber 11 by the gas exhaust plate 14. The gas exhaust plate 14 captures or reflects the plasma generated in the substrate processing chamber 15 to prevent leakage of the plasma to the manifold 16.

A TMP (Turbo Molecular Pump) (not shown) and a DP (Dry Pump) (not shown) are connected to the gas exhaust pipe 17. The chamber 11 is evacuated and depressurized by those pumps. Specifically, the DP depressurizes the inside of the chamber 11 from the atmospheric pressure to a medium vacuum state (e.g., $1.3 \times 10$ Pa (0.1 Torr) or less). The TMP depressurizes the inside of the chamber 11 to a high vacuum state (e.g., $1.3 \times 10^{-3}$ Pa ($1.0 \times 10^{-5}$ Torr) or less) which is lower than the medium vacuum state in cooperation with the DP. The pressure in the chamber 11 is controlled by an APC (Automatic Pressure Control) valve (not shown).

The susceptor 12 is connected to a first high frequency power supply 18 via a first matching unit (M) 19 and also connected to a second high frequency power supply 20 via a second matching unit (M) 21. The first high frequency power supply 18 applies to the susceptor 12 a high frequency power having a relatively low frequency of, e.g., 2 MHz for ion attraction. The second high frequency power supply 20 applies to the susceptor 12 a higher frequency power having a relatively high frequency of, e.g., 60 MHz for plasma generation. Thus, the susceptor 12 serves as an electrode. Further, the first and the second matching unit 19 and 21 maximize the efficiency of application of the high frequency power to the susceptor 12 by reducing reflection of the high frequency power from the susceptor 12.

At the upper portion of the susceptor 12, a small-diameter cylinder protrudes coaxially from a top surface of a large-diameter cylinder, so that a stepped portion is formed so as to surround the small-diameter cylinder. An electrostatic chuck 23 made of ceramic and containing therein an electrostatic electrode plate 22 is disposed at a top surface of the cylinder of the small-diameter. A DC power supply 24 is connected to the electrostatic electrode plate 22. When a positive DC voltage is applied to the electrostatic electrode plate 22, a negative potential is generated on a surface (backside) of the wafer W which faces the electrostatic chuck 23. Accordingly, a potential difference is generated between the electrostatic electrode plate 22 and the backside of the wafer W. The wafer W is attracted and held on the electrostatic chuck 23 by Coulomb force or Johnsen-Rahbek force by the potential difference.

A focus ring (FR) 25 that is a ring-shaped member is mounted on the stepped portion formed at the upper portion of the susceptor 12 to surround the wafer W attracted and held on the electrostatic chuck 23. The focus ring 25 is made of, e.g., silicon. Since the focus ring 25 is made of semiconductor, a plasma distribution region is extended from a space above the wafer W to a space on the focus ring 25. Accordingly, the plasma density on the peripheral portion of the wafer W is maintained at a level substantially equal to that on the central portion of the wafer W. As a result, the plasma etching can be uniformly performed on the entire surface of the wafer W.

In addition, a cover ring 33 made of insulating material (yttria ($Y_2O_3$) or the like) is provided to surround the outer periphery of the focus ring 25. The cover ring 33 serves to protect the susceptor 12, the electrostatic chuck 23 and the focus ring 25 from a plasma.

A shower head 26 is provided at a ceiling portion of the chamber 11 so as to face the susceptor 12. The shower head 26 includes an upper electrode plate 27, a cooling plate 28 that detachably holds the upper electrode plate 27, and a cover 29 covering the cooling plate 28. The upper electrode plate 27 is made of a semiconductor, e.g., Si, and is formed of a circular plate-shaped member having a plurality of gas holes 30 penetrating therethrough in a thickness direction thereof.

A buffer space 31 is provided in the cooling plate 28 and a processing gas introduction line 32 is connected to the buffer space 31. In the substrate processing apparatus 10, a processing gas supplied from the processing gas introduction line 32 into the buffer space 31 is introduced into the substrate processing chamber 15 through the gas holes 30. The processing gas introduced into the substrate processing chamber 15 is excited into a plasma by a high frequency power for plasma generation which is applied from the second high frequency power supply 20 into the substrate processing chamber 15 via the susceptor 12. Ions in the plasma are attracted toward the wafer W by high frequency power for ion attraction which is applied from the first high frequency power supply 18 to the susceptor 12. As a consequence, the plasma etching is performed on the wafer W.

At this time, e.g., if the focus ring 25 or the upper electrode plate 27 is not maintained at a predetermined temperature, plasmas generated for different wafers W may have different states, which may result in different qualities for the different wafers w. To avoid this problem, as an example of the substrate processing apparatus 10, the substrate processing system includes, e.g., a temperature measuring device for measuring the temperature of the focus ring 25.

Figure 2:
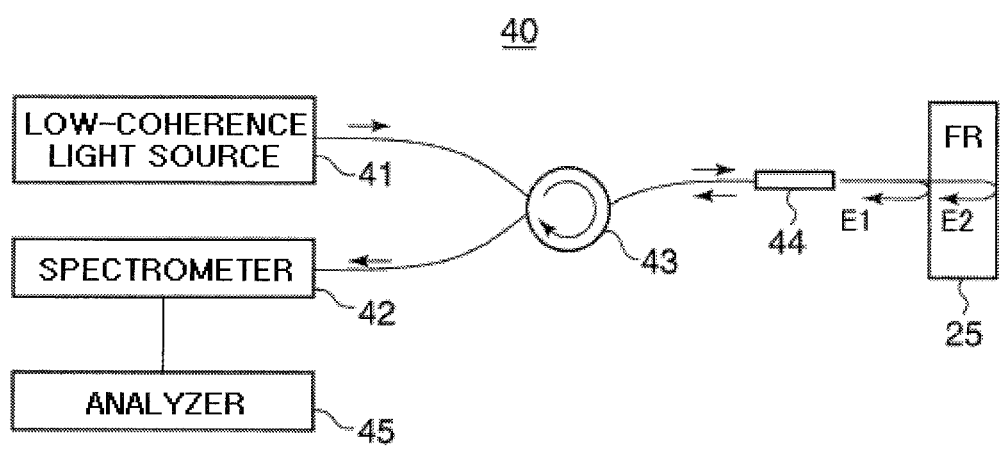
FIG. 2 is a block diagram showing a configuration of the temperature measuring device applied to the substrate processing apparatus shown in FIG. 1.

FIG. 2 is a block diagram showing a general configuration of a temperature measuring device 40 applied to the substrate processing apparatus 10. The temperature measuring device 40 includes a low-coherence light source 41, a spectroscope 42, an optical circulator 43, a collimator 44 (see, e.g., FIG. 1) and an analyzer 45. Connection between the low-coherence light source 41 and the optical circulator 43, connection between the spectroscope 42 and the optical circulator 43 and connection between the optical circulator and the collimator 44 are made by using optical fiber cables.

The low-coherence light source 41 outputs a low-coherence light of a frequency transmitting through the focus ring 25. Since the focus ring 25 is made of silicon (Si) as described above, as for the low-coherence light source 41, it is possible to use an SLD (Super Luminescent Diode) which outputs a low-coherence light having a central wavelength $\lambda_x$ of 1.55 μm or 1.31 μm and a coherence length of about 50 μm, at a maximum output of 1.5 mW. Examples of material through which the low-coherence light having the wavelength can transmit may include quartz ($SiO_2$), sapphire ($Al_2O_3$) and the like, in addition to silicon (Si).

The optical circulator 43 transmits the low-coherence light outputted from the low-coherence light source 41 to the collimator 44. The collimator 44 emits the low-coherence light collimated as a parallel ray to a predetermined position on the focus ring 25, receives the reflection light from the position, and transmits the received light to the optical circulator 43. The reflection light from the focus ring 25 includes a reflection light from a surface of the focus ring 25 and a reflection light which traveled through a predetermined path within the focus ring 25. The predetermined position on the focus ring 25 irradiated with the low-coherence light and the predetermined path of the low-coherence light within the focus ring 25 will be described later with reference to FIG. 7.

The spectroscope 42 generally includes a light dispersion element and a light receiving element. The light dispersion element disperses the reflection light transmitted through the optical fiber cable at a predetermined dispersion angle for each different wavelength. As the light dispersion element, a diffraction grating may be used. The light receiving element receives the reflection light dispersed by the light dispersion element to detect a spectrum (intensity vs. wavenumber) of the received reflection light. Specifically, the light receiving element includes a plurality of CCD (Charge Coupled Device) elements arranged in a grid pattern.

Since the light receiving element includes photoelectric conversion elements such as CCD elements as described above, a signal of the reflection light spectrum outputted from the spectroscope 42 to the analyzer 45 is an analog electrical signal. For this reason, the analyzer 45 includes an A/D converter for converting the analog signal outputted from the spectroscope 42 into a digital signal, and an operation unit such as a personal computer (PC) for calculating an optical path length by performing Fourier transform for the digital signal representing the reflection light spectrum received from the A/D converter and calculating a temperature based on the optical path length. The operation unit (i.e., PC) performs operation such as Fourier transform by a CPU executing a specified software (program) stored in a ROM, a RAM or a hard disk drive. The Fourier transform used herein is a process of transforming a function of a wavenumber (or frequency or wavelength) variable into a function of a distance variable.

Figure 3A:
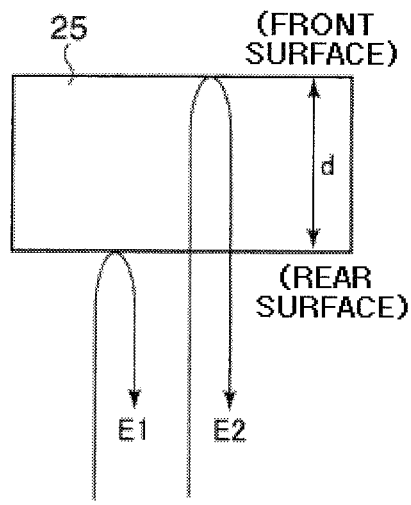
FIGS. 3A to 3C are schematic views for explaining the principle of measuring an optical path length in a focus ring by using a low-coherence light by the temperature measuring device shown in FIG. 2.
Figure 3B:
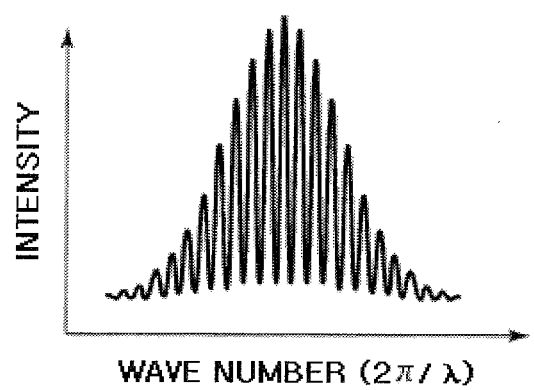
Figure 3C:
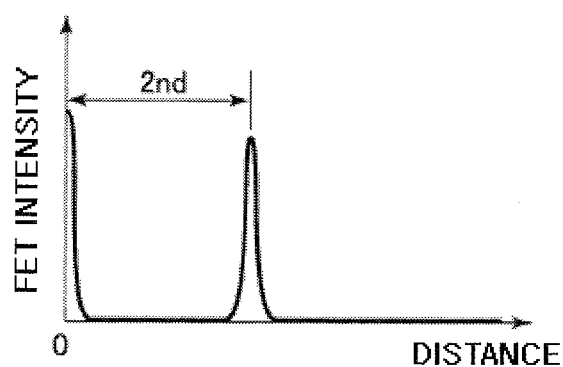
Figure 7:
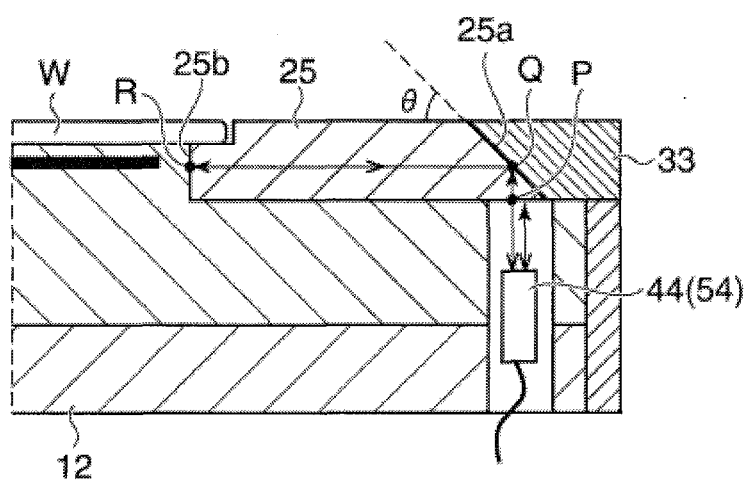
FIG. 7 is a schematic diagram showing structures of a focus ring and a cover ring of the substrate processing apparatus shown in FIG. 1 and a low-coherence light traveling path within the focus ring.

FIGS. 3A to 3C are views for explaining a principle of measuring an optical path length within the focus ring 25 by using a low-coherence light by the temperature measuring device 40. FIG. 3A is a schematic view showing a reflection light obtained when a low-coherence light is irradiated from a rear surface side of the focus ring 25 toward the front surface thereof. As shown in FIG. 7 which will be described later, a path of the low-coherence light within the focus ring 25 is not as simple as FIG. 3A. Since, however, there is no difference in both cases of FIG. 3A and FIG. 7 in inputting to the spectroscope 42 a reflection light from the rear surface of the focus ring 25 and a reflection light transmitting through the focus ring 25 and reflected at the front surface thereof to perform the Fourier transform by using a reflection light spectrum, the description will be given for the case of FIG. 3A in which the path of low-coherence light within the focus ring 25 is replaced with a path of low-coherence light reciprocating in the thickness direction.

It is here assumed that a refractive index of the focus ring 25 is "n" and a thickness thereof is "d". The thickness d corresponds to ½ (i.e., P→Q→R) of a length of a traveling path (i.e., P→Q→R→Q→P) of low-coherence light within the focus ring 25 shown in FIG. 7.

A portion of the low-coherence light irradiated on the focus ring 25 is reflected at the rear surface of the focus ring 25 (i.e., reflection light E1), and a portion of the low-coherence light incident to the focus ring 25 is reflected at the front surface of the focus ring 25 (i.e., reflection light E2). Since an optical path difference between the reflection light E1 and the reflection light E2 is $2^{nd}$ (2×n×d) and the refractive index n is previously known, the thickness d can be obtained by calculating the optical path difference, i.e., 2nd. Further, a higher order reflection light may be generated, but description thereof is omitted.

FIG. 3B is a schematic diagram presenting a spectrum distribution (intensity vs. wavenumber) of reflection light incident to the spectroscope 42. When a reflectivity at the front and the rear surfaces of the focus ring 25 is denoted by "R", the wavelength of low-coherence light is denoted by "λ", the wavenumber is denoted by $k(=2\Pi/\lambda)$, a spectrum of incident wave to the focus ring 25 is denoted by "S(k)", the spectrum distribution I(k) of reflection light incident to the spectroscope 42 is as the following Eq. 1. "cos(2nkd)" in Eq. 1 represents an interference between the reflection light E1 and the reflection light E2 at the front and the rear surfaces.

FIG. 3C is a schematic diagram of a result spectrum obtained by performing Fourier transform on the spectrum distribution shown in FIG. 3B. By the PC of analyzer 45, Eq. 1 is subjected to Fourier transform to obtain following Eq. 2, and thus, a spectrum reflecting the optical path difference (2nd) between the reflection lights E1 and E2, i.e., the optical path length within the focus ring 25 can be obtained as shown in FIG. 3C. Since the optical path length (i.e., optical path difference (2nd)) can be obtained from the spectrum in FIG. 3C thus obtained and the refractive index n is previously known, the thickness d can be calculated. Details of a calculation method for calculating the optical path length by performing Fourier transform on the reflection light spectrum are described in, e.g., JP2013-029487A and, therefore, detailed explanation thereof is omitted herein.

$$I(k) \propto \{2R(1-R)-2R(1-2R)\cos(2nkd)\}S(k) \quad \text{Eq. 1}$$

$$I(x)=2R(1-R)\cdot S(x)-R(1-2R)\cdot\{S(x+2nd)+S(x-2nd)\} \quad \text{Eq. 2}$$

Figure 4:
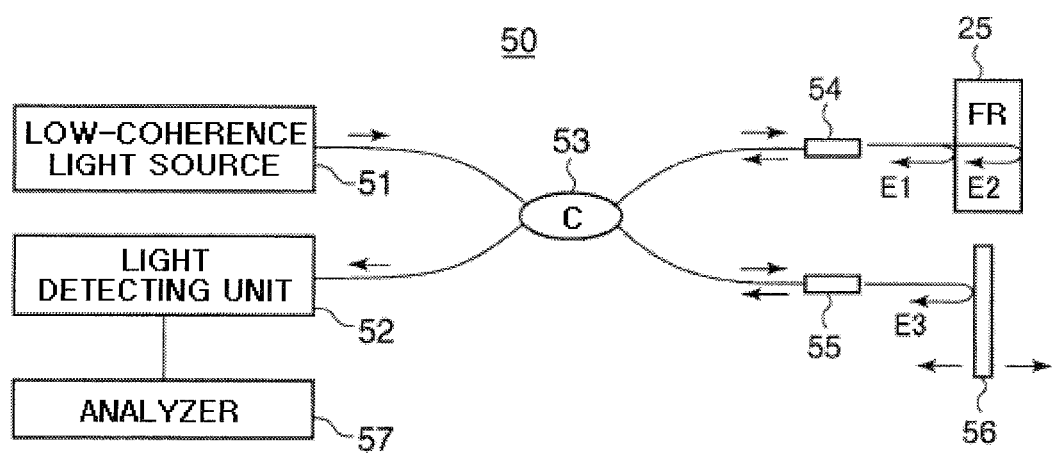
FIG. 4 is a block diagram showing the general configuration of another temperature measuring device applied to the substrate processing apparatus shown in FIG. 1.

FIG. 4 is a schematic block diagram showing a configuration of another temperature measuring device 50 applied to the substrate processing apparatus 10. The temperature measuring device 50 is configured as a so-called Michelson interferometer and includes a low-coherence light source 51, a light detecting unit 52, a 2×2 coupler (C) 53, a first collimator 54, a second collimator 55, a reference mirror 56 and an analyzer 57. Connection between the low-coherence light source 51 and the 2×2 coupler 53, connection between the light detecting unit 52 and the 2×2 coupler 53 and the connections between the 2×2 coupler 53 and the first and the second collimators 54 and 55 are made by using an optical fiber cables.

The low-coherence light source 51 is identical to the low-coherence light source 41 of the temperature measuring device 40. Further, the first collimator 54 and the second collimator 55 have a function which is the same as that of the collimator 44 of the temperature measuring device 40. That is, the first collimator 54 irradiates a low-coherence light onto the focus ring 25 and receives a reflection light thereof and the second collimator 55 irradiates a low-coherence light onto the reference mirror 56 and receives a reflection light thereof.

The 2×2 coupler 53 divides a low-coherence light outputted from the low-coherence light source 51 into two low-coherence lights and transmits the two low-coherence lights respectively to the first collimator 54 and the second collimator 55. Further, the 2×2 coupler 53 receives the reflection light of the low-coherence light irradiated onto the focus ring 25 from the first collimator 54 and reflected at the focus ring 25 and the reflection light of the low-coherence light irradiated onto the reference mirror from the second collimator 55 and reflected at the reference mirror 56 and transmits the received reflection lights to the light detecting unit 52.

The reference mirror 56 is movable by a driving unit (not shown) in a direction parallel to irradiation direction of the low-coherence light irradiated from the second collimator 55 and the movement of the reference mirror 56 is controlled by the analyzer 57.

The light detecting unit 52 which is, e.g., a Ge photodiode outputs an interference waveform of the received reflection lights to the analyzer 57. A signal of the interference waveform outputted from the light detecting unit 52 to the analyzer 57 is an analog electrical signal. With that reason, the analyzer 57 includes an A/D converter for converting the analog signal outputted from the light detecting unit 52 into a digital signal, and an operation unit such as a personal computer (PC) for calculating an optical path length by using interference waveform data received from the A/D convertor and calculating a temperature based on the obtained optical path length.

The reflection light from the focus ring 25 includes a reflection light from a rear surface of the focus ring 25 and a reflection light which has traveled through a path within the focus ring 25. Each of two reflection lights from the focus ring 25 greatly interferes with the reflection light from the reference mirror 56 when the reference mirror 56 is positioned in a predetermined location. Therefore, the optical path length of the low-coherence light within the focus ring 25 can be measured by obtaining a relationship between a moving distance of the reference mirror 56 and a location where a great interference waveform occurs.

Figure 5A:
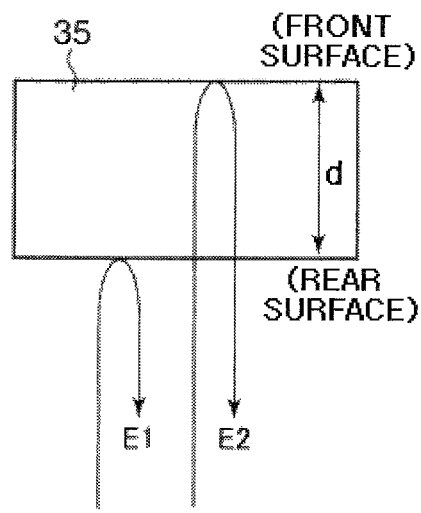
FIGS. 5A and 5B are schematic views for explaining the principle of measuring of an optical path length in a focus ring by using a low-coherence light by the temperature measuring device shown in FIG. 4.
Figure 5B:
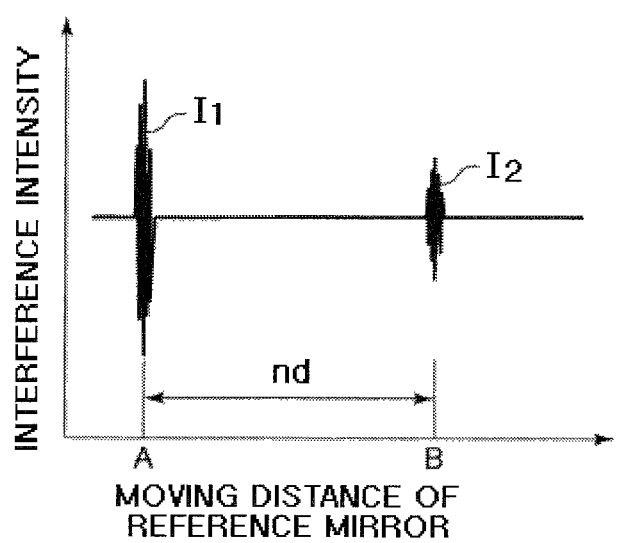

FIGS. 5A and 5B are views for explaining a principle of measuring an optical path length within the focus ring 25 by using a low-coherence light by the temperature measuring device 50. FIG. 5A is a schematic view showing reflection forms of low-coherence lights within the focus ring 25. Since FIG. 5A is identical to FIG. 3A, explanation thereof is omitted herein. Each of the reflection lights E1 and E2 has a constant optical path length. Meanwhile, an optical path length of a reflection light E3 from the reference mirror 56 can be changed by moving the position of the reference mirror 56 in a direction parallel to an incident direction of the low-coherence light (see, FIG. 4). When the optical path length of the reflection light E1 and that of the reflection light E3 coincide and the optical path length of the reflection light E2 and that of the reflection light E3 coincide, great interferences generate therebetween.

FIG. 5B is a diagram showing a relationship between a moving distance of the reference mirror 56 and interference waveforms incident to the light detecting unit 52. The interference waveforms $I_1$ and $I_2$ respectively represent great interferences occurring when the reference mirror 56 is positioned at the point A and the point B and a distance between the interference waveforms $I_1$ and $I_2$ corresponds to a half (nd) of the optical path difference (2nd) between the reflection lights $E_1$ and $E_2$. Since the refractive index n is previously known, the optical path difference 2nd, i.e., the optical path length within the focus ring 25 can be calculated by referring to FIG. 5B. Details of calculating the optical path length by using the interference waveforms are described in, e.g., JP2012-204742A and, therefore, detailed explanation thereof is omitted herein.

The optical path length of the low-coherence light within the focus ring 25 varies depending on a temperature of the focus ring 25 according to a coefficient of thermal expansion of a material of the focus ring 25. Therefore, a relationship between the optical path length of low-coherence light within the focus ring 25 and a temperature of the focus ring 25 is previously defined by using a black body furnace or the like to obtain data which are stored in a storage unit such as a ROM, a non-volatile RAM, a hard disk drive or the like included in the analyzer 45 and 57.

Figure 6:
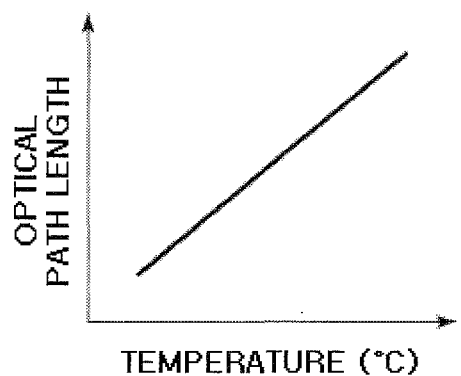
FIG. 6 is a schematic diagram showing a relationship between a temperature of a focus ring and an optical path length of a low-coherence light within the focus ring of substrate processing apparatus shown in FIG. 1.

FIG. 6 is a schematic diagram showing the relationship between the temperature of the focus ring 25 and the optical path length of the low-coherence light within the focus ring 25. The data are used in the temperature measuring devices 40 and 50 in common. Hereinafter, a low-coherence light traveling path within the focus ring 25 will be described.

FIG. 7 is a schematic diagram showing structures of the focus ring 25 and the cover ring 33 and the low-coherence light traveling path within the focus ring 25. The low-coherence light irradiated from the collimator 44 (or the first collimator 54) toward the rear surface of focus ring 25 which is not worn with a laps of time is divided into a portion (corresponding to the reflection light $E_1$) which returns to the collimator 44 (or the first collimator 54) after being reflected at an incident position, i.e., the point P and a portion which enters the focus ring at the point P. Hereinafter, the low-coherence light entering the focus ring 25 at the point P is referred to as an "entering light".

The focus ring 25 includes an inclined surface 25a formed as a reflection surface for reflecting the entering light thereat. The entering light reaches the point Q in the inclined surface 25a. The cover ring 33 prevents the inclined surface 25a from being worn. The angle θ between an incident direction of the entering light and the inclined surface 25a is set to be about 45°. Therefore, the traveling direction of the entering light is changed to a horizontal direction (i.e., the diametric direction of the focus ring 25) at the point Q and, therefore, the entering light proceeds to reach the point R in a wall surface 25b in an inner diameter side of the focus ring 25. Further, the inclined surface 25a is preferably a mirror surface.

The wall surface 25b is parallel to a thickness direction of the focus ring 25 (vertical direction) and is preferably a mirror surface. Therefore, the entering light which has reached the point R is reflected thereat and returns to the point Q. Thereafter, the traveling direction of the entering light is changed to the vertical direction (the thickness direction of the focus ring 25) at the point Q and the entering light is incident into the collimator 44 (or the first collimator 54) via the point P as a reflection light (corresponding to the reflection light E2).

Therefore, the optical path length of the entering light within the focus ring 25 can be obtained by multiplying an actual distance of point P→Q→R→Q→P and the refractive index of the material of the focus ring 25. Further, when the temperature of focus ring 25 is changed, the optical path length within the focusing ring 25 is also changed by thermal expansion. Therefore, in order to obtain data in FIG. 6, the optical path length of point P→Q→R→Q→P shown in FIG. 7 may be previously measured as the optical path length of the vertical axis in FIG. 6.

By using any of the temperature measuring devices 40 and 50 respectively shown in FIG. 2 and FIG. 4, it is possible to measure the optical path length of point P→Q→R→Q→P shown in FIG. 7, as the optical path difference between the reflection lights E1 and E2 described by referring to FIGS. 3A to 3C and 5A and 5B, during the operation of the substrate processing apparatus 10. Therefore, the temperature or temperature change of the focus ring 25 during, e.g., a plasma etching process can be figured out based on the optical path length measured by the temperature measuring device 40 or 50 and the data shown in FIG. 6.

Figure 8:
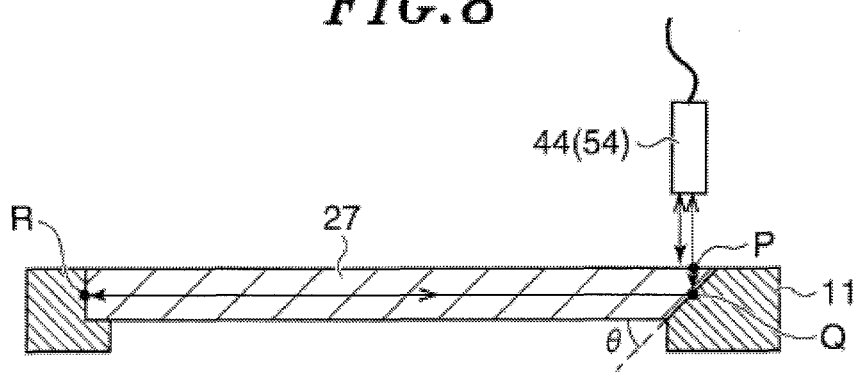
FIG. 8 is a schematic diagram showing structures of an upper electrode plate and a chamber and a traveling path of a low-coherence light within the upper electrode plate of the substrate processing chamber shown in FIG. 1.

FIG. 8 is a schematic diagram showing structures of the upper electrode plate 27 and an upper electrode holding portion of the chamber 11 and a traveling path of a low-coherence light within the upper electrode plate 27. Since the upper electrode plate 27 is formed of, e.g., silicon which is the same material as that of the focus ring 25, a temperature of the upper electrode plate 27 can be measured during, e.g., plasma generation as the case of measuring a temperature of the focus ring 25.

That is, in a case of measuring a temperature of the upper electrode plate 27, a top surface of the upper electrode plate 27 is a surface which is not worn with a lapse of time and, thus, the low-coherence light is irradiated toward the top surface of the upper electrode plate 27 from a direction perpendicular to the top surface thereof as shown in FIG. 8. An inclined surface is also provided at the upper electrode 27 to be inclined with respect to the incident direction of the low-coherence light (entering light) by about 45° and a path of the entering light within the upper electrode plate 27 is P→Q→R→Q→P as shown in FIG. 8. Therefore, an optical path length of the entering light can be obtained by multiplying a distance of the path (actual distance) and a refractive index of the material of the upper electrode plate 27.

Further, in FIG. 8, the point R is opposite to the point Q at the upper electrode plate 27 in a diametric direction of the upper electrode plate 27. Although the gas holes 30 are formed in the upper electrode plate 27, the gas holes 30 may not be formed on a line connecting the points R and Q.

Figure 9A:
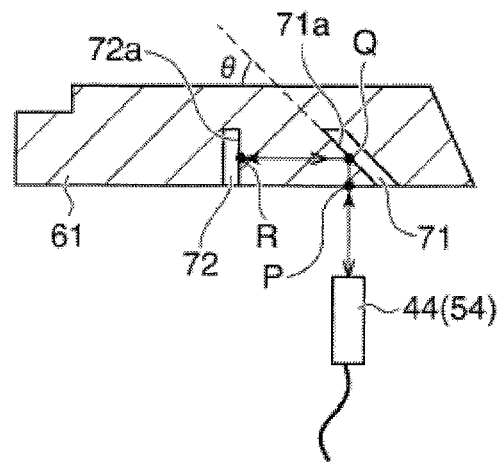
FIGS. 9A to 9C are diagrams illustrating modification examples in which an optical path length of entering light within a focus ring as an example is made to be shorter.
Figure 9B:
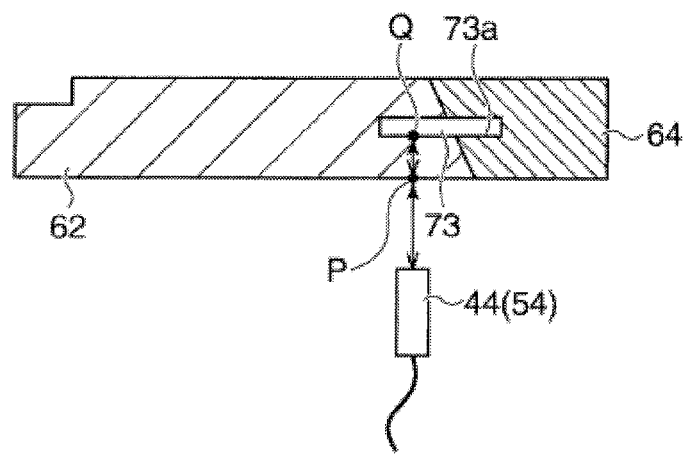
Figure 9C:
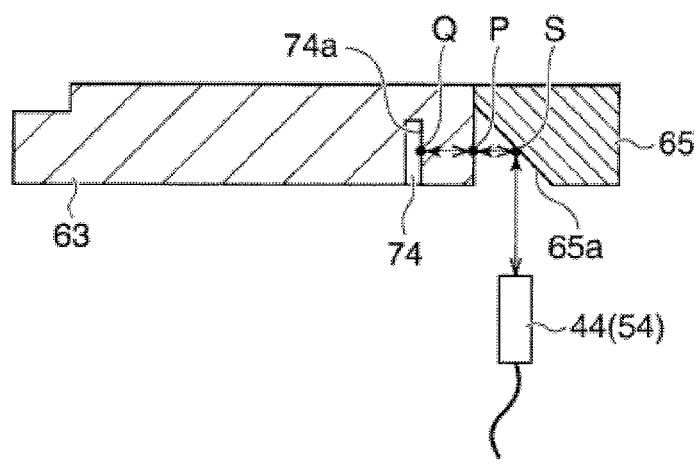

FIGS. 9A to 9C are diagrams illustrating modification examples in which the optical path length of entering light within, e.g., the focus ring 25 is made to be shorter. By shortening the optical path length of entering light, attenuation in the entering light can be suppressed, a strong reflection light spectrum can be obtained in the case of using the temperature measuring device 40, and a great interference waveform can be obtained in the case of using the temperature measuring device 50.

Herein, measurement limitation of optical path length of the entering light depends on resolution of the spectroscope 42. Therefore, by shortening the optical path length of the entering light, the temperature measuring device 40 can be applied in a further wide range. Moreover, in the case of the temperature measuring device 50, scanning time by the reference mirror 56 is reduced, whereby more effective temperature measurement is possible.

In descriptions on FIGS. 9A to 9C, structures of focus rings 61 to 63 and traveling paths of entering lights within the respective focus rings 61 to 63 are mainly focused on.

The focus ring 61 shown in FIG. 9A has a structure of the focus ring 25 shown in FIG. 7 to which a first slit 71 is provided at an outer peripheral portion thereof to intersect the diametric direction (horizontal direction) of the focus ring 25 at an angle θ, e.g., 45° and a second slit is provided radially inner of the first slit 71 to be parallel to the thickness direction (vertical direction) of the focus ring 25. An angle between the incident direction of the entering light and the first slit 71 is set to be about 45° and the entering light travels through a path of P→Q→R→Q→P. A radially inner surface 71a of the first slit 71 where the point Q exists and a radially outer surface 72a of the second slit 72 where the point R exists are preferably mirror surfaces to increase reflection efficiencies.

Further, the first and the second slits 71 and 72 are respectively provided at the outer side and the inner side in the focus ring 61, however, their positions may be reversed. In that case, the inclined direction of the first slit 71 may be reversed (i.e., be symmetric with respect to the horizontal direction) while the angle between the first slit 71 and the horizontal direction is maintained at 45°.

The focus ring 62 shown in FIG. 9B has a structure of the focus ring 25 shown in FIG. 7 in which a slit 73 is provided in an outer peripheral portion thereof to be parallel to the horizontal direction. In the focus ring 62, the entering light travels a path of P→Q→P. Further, a bottom surface 73a (in the side of the collimator 44) of the slit 73 where the point Q exists is preferably a mirror surface to increase reflection efficiency. Further, at an outer periphery of the focus ring 62, a cover ring 64 is disposed. The cover ring 64 includes a function of preventing deposits from depositing on the bottom surface of the slit 73 or the like. Although, in FIG. 9B, the slit 73 is extended in the cover ring 64, the cover ring 64 may not include a slit.

The focus ring 63 shown in FIG. 9C includes an outer peripheral wall parallel to a thickness direction of the focus ring 63 and a slit 74 formed at the radially inner side of the outer peripheral wall to be parallel to the thickness direction. At an outer periphery of the focus ring 63, a cover ring 65 is disposed and an inner peripheral surface of the cover ring 65 includes as an inclined surface 65a to reflect the low-coherence light into the outer peripheral wall.

The low-coherence light is irradiated from the collimator 44 (or the first collimator 54) to the inclined surface 65a of the covering 65 and incident into the focus ring 63 at a point P after a traveling direction thereof is changed toward the outer peripheral wall of the focus ring 63 at a point S on the inclined surface 65a. The entering light travels through a path of P→Q→P within the focus ring 63 and, then, travels back along the path to return to the collimator 44 (or the first collimator 54). Further, a radially outer surface 74a of the slit 74 where the point Q exists and the inclined surface 65a of the cover ring 65 are preferably mirror surfaces to increase reflection efficiencies.

The different traveling paths of low-coherence light shown in FIGS. 9A to 9C can be also applied to the upper electrode plate 27.

As described above, in accordance with the embodiments of the present invention, in order to measure, by using an interference between low-coherence lights, a temperature of a component such as the focus ring 25 or the upper electrode plate 27 disposed in the chamber 11 which is worn with a lapse of time, an optical path length of a low-coherence light within the component is obtained. At this time, a traveling path of the low-coherence light within the component is set such that a surface of the component which is worn or is deposited with a foreign material is not used as a reflection surface for obtaining a reflection light. With this, since the optical path length within the component is not changed due to abrasion of the component or deposition of a foreign material on the component, the optical path length depending on a temperature change can be consistently measured and, therefore, a precise temperature of the component can be obtained.

While the embodiment of the present invention has been described, the present invention is not limited thereto. For example, the object to be temperature-measured is not limited to the focus ring 25 and the upper electrode plate 27. That is, the present invention can be applied to all components formed of a material to which a low-coherence light is transmitted and, thus, a temperature of wafer W can be measured for example. In this case, an inner peripheral surface of the focus ring 25 may include an inclined surface as the inclined surface 65a of the cover ring 65 shown in FIG. 9C and a low-coherence light may be irradiated onto a side surface of the wafer W.

Further, in the above-described embodiment, the low-coherence light is guided into the component via the inclined surface which intersects the incident direction of low-coherence light to the component at about 45°, however, the angle of the inclined surface with respect to the incident direction of the low-coherence light may be appropriately set according to the shape of the component without being limited thereto.

An apparatus to which the temperature measuring method in accordance with the above-described embodiment is applied is not limited to the substrate processing apparatus in which plasma etching or plasma ashing is performed and the component provided in the chamber 11 is worn, and the method may be also applied to a substrate processing apparatus in which, e.g., plasma CVD film forming or the like is performed, whereby foreign materials are deposited on the component with a lapse of time. In this case, with respect to a component to which the foreign materials are deposited, a surface of the component on which the foreign materials are deposited is not set as a reflection surface to reflect the irradiated low-coherence light thereat and the reflection surface is set by other surface than the surface of the component on which the foreign materials are deposited.

Further, the substrate to be processed in the substrate processing apparatus is not also limited to the wafer W. For example, the substrate processing apparatus in accordance with the embodiment of the present invention may be an apparatus which treats a glass substrate for FPD (Flat Panel Display), a photomask, a CD substrate, and print substrate or the like other than the wafer W.

While the invention has been shown and described with respect to the embodiments, it will be understood by those skilled in the art that various changes and modifications may be made without departing from the scope of the invention as defined in the following claims.

What is claimed is:

1. A temperature measuring method of a component disposed in a substrate processing chamber, the component including at least one surface being worn or being deposited with a foreign material with a lapse of time, the method comprising:
   providing data representing a relationship between a temperature of the component and an optical path length of a predetermined path within the component;
   measuring an optical path length of the predetermined path within the component by using optical interference of reflection lights of a low-coherence light from the component when the low-coherence light is irradiated onto the component to travel through the predetermined path; and
   obtaining a current temperature of the component by comparing the measured optical path length with the data,
   wherein the predetermined path is set such that a portion of the low-coherence light entering into the component through a first surface of the component which is not worn and is not deposited with a foreign material is reflected at a reflection surface of the component to proceed to a second surface of the component which is not worn and is not deposited with a foreign material and travels back along a route through which the portion of the low-coherence light has traveled, after being reflected at the second surface.

2. The temperature measuring method of claim 1, wherein the component has a plate-like shape, the reflection surface is inclined with respect to the first surface at an angle of about 45° and the second surface is substantially perpendicular to the first surface.

3. The temperature measuring method of claim 1, wherein the component has a plate-like shape and contains a first slit which is formed to be inclined with respect to the first surface at an angle of about 45° and a second slit which is formed to be substantially perpendicular to the first surface, and wherein the refection surface is a surface of the first slit and the second surface is a surface of the second slit.

4. The temperature measuring method of claim 1, wherein the component is an electrode plate constituting a shower head disposed in the substrate processing chamber or a focus ring disposed in the substrate processing chamber.

5. The temperature measuring method of claim 1, wherein the reflection lights include a first reflection light reflected at the first surface and a second reflection light reflected at the second surface, and wherein the optical path length is measured by performing Fourier transform on an interference light of the first reflection light and the second reflection light.

6. The temperature measuring method of claim 1, wherein a basic low-coherence light irradiated from a light source is divided into a first low-coherence light and a second low-coherence light, and wherein, in the measuring the optical path length, the low-coherence light is the first low-coherence light, the reflection lights include a first reflection light reflected at the first surface and a second reflection light reflected at the second surface and the second low-coherence light is irradiated onto a reference mirror to obtain a third reflection light reflected at the reference mirror while moving the reference mirror in a direction parallel to an incident direction of the second low-coherence light, and the optical path length is obtained by using an interference light of the first reflection light, the second reflection and the third reflection light and a moving distance of the reference mirror.

7. A temperature measuring method of a component disposed in a substrate processing chamber, the component including at least one surface being worn or being deposited with a foreign material with a lapse of time, the method comprising:

providing data representing a relationship between a temperature of the component and an optical path length of a predetermined path within the component;

measuring an optical path length of the predetermined path within the component by using optical interference of reflection lights of a low-coherence light from the component when the low-coherence light is irradiated onto the component to travel through the predetermined path; and obtaining a current temperature of the component by comparing the measured optical path length with the data, wherein the predetermined path is set such that a portion of the low-coherence light entering into the component through an entrance surface of the component which is not worn and is not deposited with a foreign material is reflected at a slit which is formed to be parallel to the entrance surface and travels back along a route through which the portion of the low-coherence light has traveled.

8. The temperature measuring method of claim 7, wherein the low-coherence light is irradiated onto a surface of another component provided adjacent to the component and is reflected at the surface of the another component to be irradiated onto the entrance surface, the surface of the another component being not worn and being not deposited with a foreign material.

9. The temperature measuring method of claim 7, wherein the component is an electrode plate constituting a shower head disposed in the substrate processing chamber or a focus ring disposed in the substrate processing chamber.

10. The temperature measuring method of claim 7, the reflection lights include a first reflection light reflected at the entrance surface and a second reflection light reflected at the slit, and wherein the optical path length is measured by performing Fourier transform on an interference light of the first reflection light and the second reflection light.

11. The temperature measuring method of claim 7, wherein a basic low-coherence light irradiated from a light source is divided into a first low-coherence light and a second low-coherence light, and wherein, in the measuring the optical path length, the low-coherence light is the first low-coherence light, the reflection lights include a first reflection light reflected at the entrance surface and a second reflection light reflected at the slit, the second low-coherence light is irradiated onto a reference mirror to obtain a third reflection light reflected at the reference mirror while moving the reference mirror in a direction parallel to an incident direction of the second low-coherence light, and the optical path length is obtained by using an interference light of the first reflection light, the second reflection light and the third reflection light and a moving distance of the reference mirror.

\* \* \* \* \*